United States Patent
Andre et al.

(10) Patent No.: US 9,019,794 B2
(45) Date of Patent: Apr. 28, 2015

(54) MEMORY DEVICE WITH REDUCED ON-CHIP NOISE

(71) Applicant: Everspin Technologies, Inc., Chandler, AZ (US)

(72) Inventors: Thomas Andre, Austin, TX (US); Syed M. Alam, Austin, TX (US); Dietmar Gogl, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 23 days.

(21) Appl. No.: 14/050,625

(22) Filed: Oct. 10, 2013

(65) Prior Publication Data

US 2014/0104963 A1  Apr. 17, 2014

Related U.S. Application Data

(60) Provisional application No. 61/712,843, filed on Oct. 12, 2012.

(51) Int. Cl.

| | |
|---|---|
| *G11C 8/12* | (2006.01) |
| *G11C 7/02* | (2006.01) |
| *G11C 5/14* | (2006.01) |
| *G11C 16/12* | (2006.01) |
| *G11C 16/30* | (2006.01) |

(52) U.S. Cl.
CPC .. *G11C 7/02* (2013.01); *G11C 5/14* (2013.01); *G11C 8/12* (2013.01); *G11C 5/145* (2013.01); *G11C 16/12* (2013.01); *G11C 16/30* (2013.01)

(58) Field of Classification Search
CPC ........... G11C 8/12; G11C 7/18; G11C 7/1006
USPC .............................................. 365/230.03, 226
See application file for complete search history.

(56) References Cited

U.S. PATENT DOCUMENTS

| | | |
|---|---|---|
| 5,563,839 A | 10/1996 | Herdt et al. |
| 6,078,540 A | 6/2000 | Keeth |
| 6,873,563 B2 * | 3/2005 | Suwa et al. ............. 365/230.03 |
| 2002/0181314 A1 | 12/2002 | Abedifard |
| 2003/0016577 A1 | 1/2003 | Siek |
| 2005/0099836 A1 | 5/2005 | Tran et al. |

OTHER PUBLICATIONS

United States International Searching Authority, International Search Report and Written Opinion for International Application No. PCT/US2013/064242, mailed Apr. 17, 2014.

* cited by examiner

*Primary Examiner* — Amir Zarabian
*Assistant Examiner* — Jason Lappas
(74) *Attorney, Agent, or Firm* — Lee & Hayes, PLLC

(57) ABSTRACT

In some examples, a memory device includes multiple memory banks equipped with an isolation switch and dedicated power supply pins. The isolation switch of each memory bank is configured to isolate the memory bank from global signals. The dedicated power supply pins are configured to connect each of the memory banks to a dedicated local power supply pads on the package substrate to provide local dedicated power supplies to each of the memory banks and to reduce voltage transfer between memory banks over conductors on the device, the device substrate, or the package substrate of the memory device.

20 Claims, 6 Drawing Sheets

MEMORY DEVICE WITH REDUCED ON-CHIP NOISE

RELATED APPLICATION

This application claims priority to U.S. Provisional Application No. 61/712,843 to Andre et al., entitled "Bias Signal Isolation and Coupling Scheme for Reducing On-Chip Noise Coupling," filed Oct. 12, 2012, the contents of which are incorporated herein by reference.

BACKGROUND

In modern memory device architectures, the memory devices are designed with multiple memory banks. Each of the memory banks are independent of the others and allow for designs in which multiple memory banks may be operated concurrently. Unfortunately, read and write access operations create noise on the internal power supplies of the memory circuits that operate the memory banks and the noise may be transferred between internal circuits of different memory banks over common bias or supply conductors within the device or on the package substrate. In some types of memory devices, such as magnetic memories, the noise generated by a read or write, operation in one memory bank is able to disturb the operations of the other banks.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
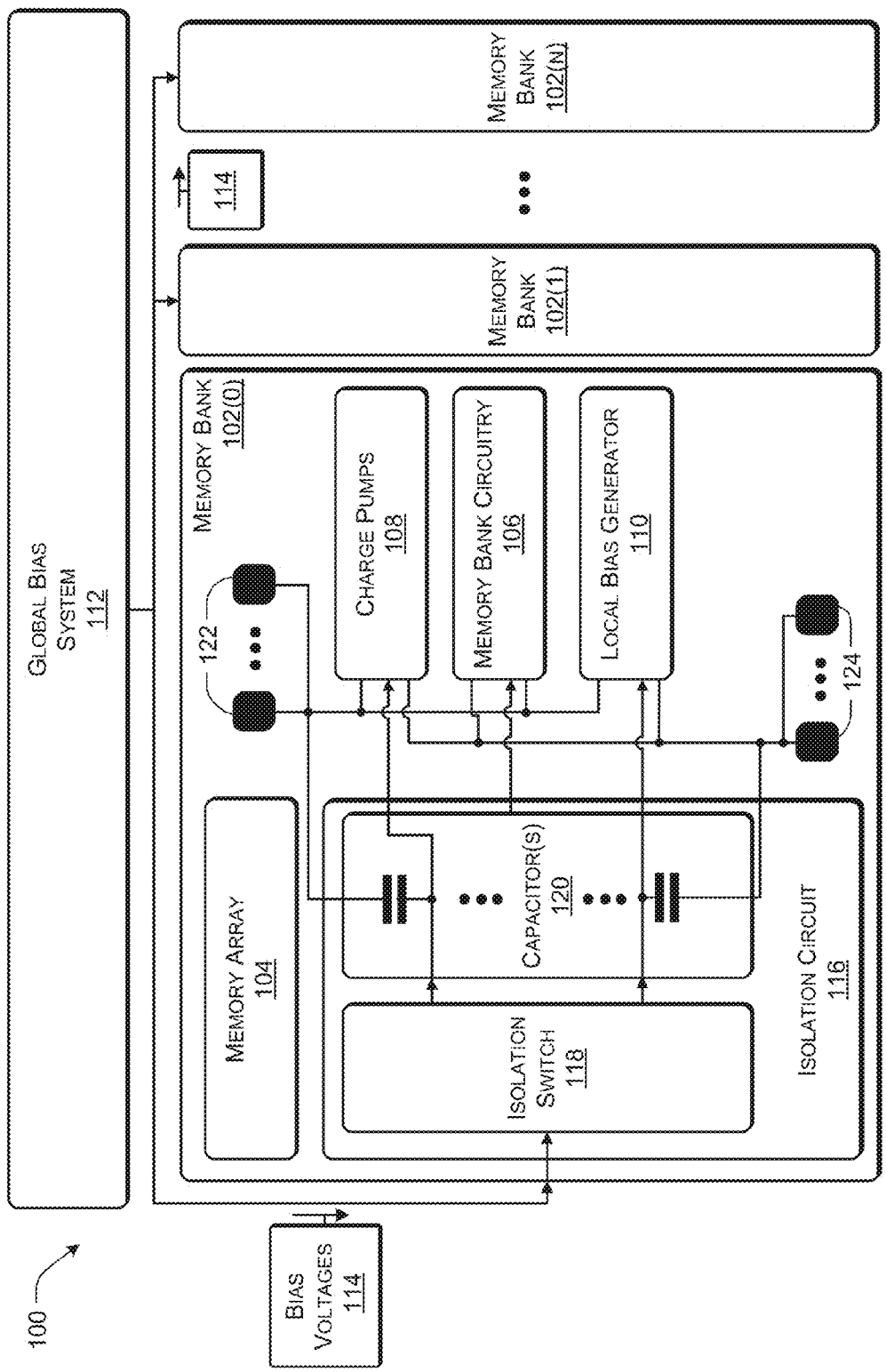
FIG. 1 illustrates an example architecture of select components of a memory device for reducing on-chip noise according to some implementations.

This disclosure includes techniques and implementations to reduce on-chip noise transfer between memory banks of a multi-bank memory device. When performing concurrent reads and/or write operations on multiple memory banks of a single memory device, the noise generated by one memory bank may create noise on the internal power supplies of memory circuitry associated with other banks. For example, the noise may disturb sensitive bias voltages that are used as references within each of the memory banks, as well as, the small current and voltage signals evaluated by the sense amplifiers during read operations. In some cases, the noise generated from one memory bank may cause errors to occur in a read or write operation being performed by another bank.

In an implementation, each memory bank of a memory device may be equipped with dedicated external power supply pins that are connected to power planes in the package substrate by individual power supply pads. In another implementation, the memory device may be equipped with an isolation circuit (e.g., a sample-and-hold circuit) including an isolation switch and a storage capacitor, referenced to the dedicated power supply, to isolate the circuitry of each memory bank. In some examples, the circuitry associated with each of the memory banks may be placed within isolating wells (e.g., buried in a triple well) on the package substrate of the memory device to further isolate the memory banks from each other. In some implementations, the internal circuitry of each memory bank receives power from the power planes on the package substrate through dedicated power supply pins and prevents noise generated by shared circuitry by utilizing the isolation circuitry.

As an illustrative, non-limiting example, a memory bank of a memory device may include internal circuitry, for example, charge pumps, sense amplifiers and/or local bias generators. The internal circuitry is connected to the dedicated external power supply pins of the memory bank that are connected to dedicated power supply pads on the package substrate to receive a power supply that is local and dedicated to the internal circuitry of the memory bank. In this manner, the internal circuitry is isolated from the noise generated by read and write operations performed by other memory banks of the memory device and noise transferred via the power supply or the package substrate. Additionally, certain internal circuitry, such as the sense amplifiers may benefit from a low noise locally generated supply voltage, which may be provided by having the sense amplifier or other noise sensitive circuitry connected to a locally generated power supply as described herein.

In some implementations, a global bias system provides global bias voltages used by the memory banks. For example, the global bias system may be configured to provide bias voltages to the memory banks to convey information (e.g., a voltage or current) for controlling the magnitude of voltage across or current through a memory bit during access operations (e.g., read or write operations) on each of the memory banks. However, the bias voltages generated by the global bias system and directed to one of the memory banks may transfer to or couple with other memory banks of the memory device. The voltage transfer may cause noise to transfer between banks leading to an error if another memory bank is performing a noise sensitive operation, such as a read operation. Furthermore, the voltage transfer may cause voltage to feedback into the global bias system resulting in erratic behavior of the global bias system, as the global bias system attempts to compensate for the feedback. Therefore, in some cases, each of the memory banks includes an isolation circuit placed between the global systems (e.g., the global bias system) and the internal circuitry of the memory bank.

The isolation circuit includes an isolation switch and at least one capacitor. In some implementations, each of the isolation switches may be formed using transfer gates. In other implementations, each of the isolation switches may be formed using a metal-oxide semiconductor (MOS), e.g., a positive metal-oxide semiconductor (PMOS) device or a negative metal-oxide semiconductor (NMOS) device. The isolation switches may be configured to respond to one or more isolation signals (e.g., a high voltage signal, a low voltage signal, or a combination signal, such as a high voltage signal and low voltage signal). The isolation switch may also be connected to a local power supply via the one or more capacitors to generate a local bias voltage on the memory bank that may be utilized as an input to internal circuitry of a memory bank (e.g., a sense amplifier or a write driver).

FIG. 1 illustrates an example architecture of select components of a memory device 100 for reducing on-chip noise according to some implementations. The memory device 100 is an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, solid state storage, magnetic disk storage, RAID storage systems, storage arrays, network attached storage, storage area networks, cloud storage, or any other medium that can be used to store information and which can be accessed by a processor.

The memory device 100 includes multiple memory banks, such as memory banks 102(0), 102(1) and 102(N). Each of the memory banks includes a memory array 104 to store the data and includes memory bank circuitry 106, as well as, other internal circuitry, such as charge pumps 108 and local bias generator 110, associated with the operation of the memory array 104. For example, the local bias generator 110 may be configured to provide local reference voltages or bias voltages associated with reading, writing, or maintaining data in the memory array 104 in some types of memory devices.

The memory device 100 also includes a number of global circuits, such as global bias system 112 for controlling access operations on the memory banks 102(0)-(N). The global systems, such as the bias system 112, are utilized to reduce duplication of parts within each of the memory banks 102(0)-(N). For example, the bias system 112 may be configured to receive input voltages related to read and write operations on various memory banks 102(0)-(N) and to direct bias voltages 114 to control the operations on each of the memory banks 102(0)-(N) in response. However, by utilizing the global bias system 112, the bias voltages 114 directed to one or more of the memory banks 102(0)-(N) may couple into the circuitry associated with other neighboring memory banks. For example, a bias voltage directed to the memory bank 102(0) may couple over into memory bank 102(1). Coupling of one or more of the bias voltages 114 between one of the memory banks 102(0)-(N) may cause an error to occur in a read and/or write operation being performed on one of the other memory bank of the memory device or may cause voltage to feedback into the bias system 112. When voltage feedback into the bias system 112, the bias system 112 becomes unpredictable and may react erratically, as the bias system 112 attempts to compensate for the excess voltage.

Therefore, each of the memory banks 102(0)-(N) includes an isolation circuit 116 connected between the global systems and the internal circuitry of the memory banks 102(0)-(N). The isolation circuit 116 may be configured to isolate the memory bank 102(0) from the bias voltages 114 generated by the bias system 112 to reduce noise caused by more than one of the memory banks 102(0)-(N) reading and/or writing data at the same time. The isolation circuit 116 includes an isolation switch 118 connected to the internal circuitry of the memory bank 102(0) on a first terminal and the global bias system 112 on a second terminal. In this manner, when the isolation switch 118 of the isolation circuitry 116 in the memory bank circuitry 106 is placed in an isolated or disconnected state, the memory bank circuitry 106, charge pumps 108, and local bias generator 110 are isolated from the bias voltages 114 generated by the bias system 112, and when the isolation switch 118 is placed in a conductive or on state, the memory bank circuitry 106, charge pumps 108, and local bias generator 110 are able to receive the bias voltages 114 from the bias system 112. The isolation switch 118 may be formed using various components such as a transfer gate, a switch, a PMOS, an NMOS, or a resistive element acting as a low pass filter, among other components.

In the embodiment illustrated in FIG. 1, the isolation circuit 116 also includes one or more capacitors 120 connected to the first terminal of the isolation switch 118 and to a local power supply on the package substrate of the memory device 100 via dedicated power supply pins 122 and 124. For example, by connecting the isolation switch 116, the capacitor(s) 120 and the internal circuitry of the memory bank 102(0) (e.g., the memory bank circuitry 106, the charge pumps 108 and the local bias generator 110) in this manner, a local bias voltage may be generated or maintained on the memory bank 102(0) that may differ from local bias voltages generated on the other memory banks 102(1)-(N). In some particular implementations, the local bias voltages generated in this way may also be used as an input to the internal circuitry of the memory banks 102(0)-(N). For example, the local bias voltage may be used as an input to a sense amplifier (not shown) for performing a read operation on one of the memory banks 102(0)-(N).

While the isolation switch 118 may be able to isolate the charge pumps 108, the local bias generator 110 and the memory bank circuitry 106 from the bias voltages generated by the global systems, noise caused by reading from or writing to one of the memory banks 102(0)-(N) may also transfer to neighboring memory banks 102(0)-(N) through the power supply conductors within the device, over the device substrate, or over the package substrate of the memory device 100. To reduce the noise transferred over the device substrate or conductors within the device via the power supply, each of the memory banks 102(0)-(N) are placed within an isolated well and are equipped with dedicated external power supply pins 122 and 124 for connecting each of the memory banks 102(0)-(N) to a dedicated local power supply. For example, each of the memory banks 102(0)-(N) may be buried in a triple well or an n-well to shield the internal circuitry of the memory banks 102(0)-(N) from the noise transferred over the device substrate of the memory device 100, while receiving power from the dedicated local power supply.

The dedicated external power supply pins 122 and 124 are connected to dedicated power supply pads on the package substrate of the memory device 100, which provide a local power supply to memory bank 102(0). Each of the other memory banks 102(1)-(N) also include dedicated external power supply pins, such as power supply pins 122 and 124, for providing dedicated local power supplies to each of the memory banks 102(1)-(N). For example, the dedicated external power supply pins 122 may be connected to a power supply (i.e., VDD) and the dedicated external power supply pins 124 may be connected to ground (i.e., VSS). The dedicated external power supply pins 122 and 124 are also connected to the memory bank circuitry 106, the charge pumps 108, the local bias generator 110 and the isolation circuit 116 for providing a dedicated local power supply to the internal circuitry of each of the memory banks 102(0)-(N). For example, the dedicated external power supply pins 122 and 124 may be connected to the capacitor(s) 120 to generate local biases that may be used by the internal circuitry of the memory bank 102(0), as discussed above.

In one example, when a read or write access operation is being performed on memory bank 102(0), the isolation switch 118 is placed in an isolated or disconnected state and the bias voltages 114 generated by the bias system 112 is isolated from the memory bank circuitry 106 of the memory bank 102(0). For example, the bias voltages 114 may be isolated from the capacitor(s) 120 storing the input to the charge pumps 108 or the local bias generator 110. In some particular implementations, the bias voltages 114 may be isolated from the capacitors 120 storing the input to the local bias generator 110, which may generate a reference voltage to use as a control input to the memory bank circuitry 106. In this example, the dedicated external power supply pins 122 and 124 provide a power supply signal to the memory bank circuitry 106, the charge pumps 108 and the local bias generator 110, while preventing noise transferring over conductors on the device or the package substrate.

In another example, when a write operation is not being performed on memory bank 102(0), the isolation switch 118 is placed in a conductive or on state to maintain or restore the bias voltages 114 generated by the bias system 112 on the capacitors 120. In this example, the dedicated external power supply pins 122 and 124 provide a power supply signal to the memory bank circuitry 106 that is substantially the same as the power supply signal provided to the bias system 112 and, therefore, is not influenced by noise. The dedicated external power supply pins 122 and 124 also provide a power supply signal to the isolation circuit 116. By including the one or more capacitors 120 in the isolation circuit 116, a local bias voltage may be maintained within the memory bank 102(0). In one particular example, the local bias voltage may be provided to the memory bank circuitry 106 of memory bank 102(0) as an input to a read operation on memory bank 102(0), while memory bank 102(1) is performing the write operation.

In the illustrated example, the internal circuitry of memory bank 102(0) is described. However, it should be understood that the internal circuitry including the isolation circuit 116 and the dedicated external power supply pins 122 and 124 may be repeated in the memory banks 102(1)-(N), such that each of the memory banks 102(1)-(N) may be isolated from the global systems and powered by a local power supply to reduce errors caused by noise associated with multiple memory banks 102(1)-(N) operating concurrently.

Figure 2:
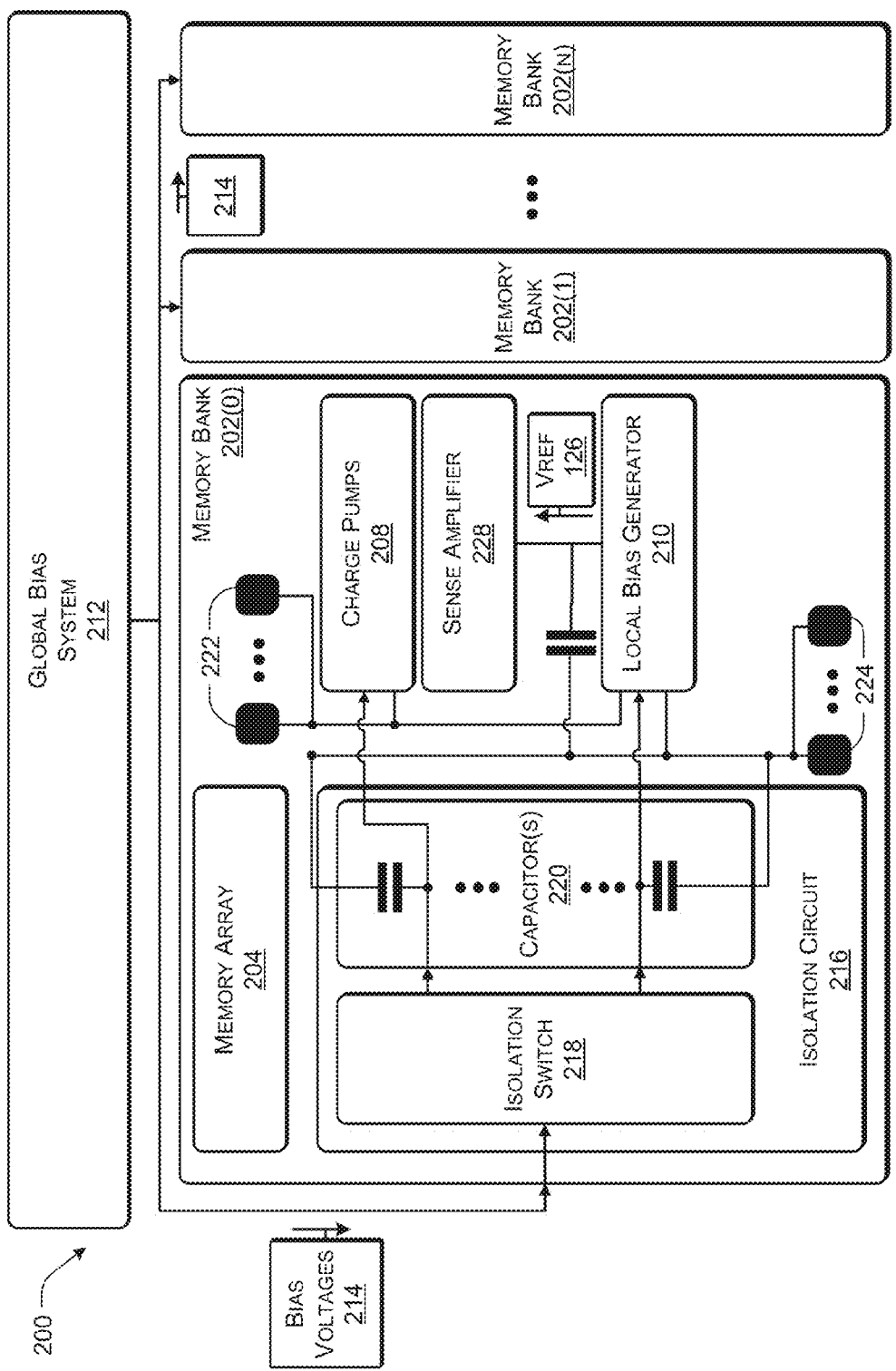
FIG. 2 illustrates another example architecture of select components of a memory device for reducing on-chip noise according to some implementations.

FIG. 2 illustrates another example architecture of select components of a memory device 200 for reducing on-chip noise according to some implementations. As in the memory device 100 of FIG. 1, the memory device 200 of FIG. 2 also includes multiple memory banks 202(0), 202(1) and 202(N). Each of the memory banks 202(0)-(N) includes similar components. For example, memory bank 202(0) includes a memory array 204 to store the data and internal memory bank circuitry associated with the operation of the memory bank 202(0), such as sense amplifier 228, charge pumps 208 and local bias generator 210.

The memory device 200 also includes a number of global circuits, such as bias system 212 for controlling the memory banks 202(0)-(N). The global systems, such as the bias system 212, are utilized to reduce duplication of parts within each of the memory banks 202(0)-(N). For example, the bias system 212 may be configured to receive input voltages related to read and write operations on various memory banks 202(0)-(N) and to direct bias voltages 214 to control the operations on each of the memory banks 202(0)-(N) in response. However, by utilizing the global bias system 212, the bias voltages 214 directed to one of the memory banks 202(0)-(N) may transfer into the circuitry associated with another of the memory banks, such as memory banks 202(1)-(N). The transferring of the bias voltages 214 may cause an undesirable change in the operation of one bank to occur in a read and/or write operation being performed on the neighboring memory bank or voltage to feedback into the bias system 212 resulting in the bias system 212 reacting erratically, as the bias system 212 attempts to compensate for the voltage feedback.

Therefore, each of the memory banks 202(0)-(N) includes isolation circuitry 216 connected between the global systems and the internal circuitry of the memory banks 202(0)-(N). The isolation circuit 216 is configured to isolate the memory bank 202(0) from the bias voltages 214 generated by the bias system 212 to reduce noise caused by more than one of the memory banks 202(0)-(N) reading and/or writing data at the same time.

The isolation circuitry 216 includes an isolation switch 218 connected to the internal circuitry of the memory bank 202(0) on a first terminal and connected to the global bias system 212 on a second terminal. In this manner, when the isolation switch 218 is placed in an isolated or disconnected state, the internal circuitry of the memory bank 202(0) is isolated from the bias voltages 214 generated by the bias system 212, and when the isolation switch 218 is placed in a conductive or on state, the internal circuitry of the memory bank 202(0) is able to receive the bias voltages 214 from the bias system 212. As described above with respect to FIG. 1, the isolation switch 218 may be formed using various components such as a transfer gate, a switch, a PMOS, a NMOS among other components.

The isolation circuitry 216 also includes one or more capacitors 220 connected to the first terminal of the isolation switch 218 and to a local power supply on the package substrate of the memory device 200 via dedicated power supply pins 222 and 224. For example, by connecting the isolation switch 218, the capacitor(s) 220 and the internal circuitry of the memory bank 202(0) (e.g., the charge pumps 208 and/or the local bias generator 210) in this manner, a local bias voltage may be generated or maintained on the memory bank 202(0) that may differ from local bias voltages generated on the other memory banks 202(1)-(N).

In some particular implementations, the local bias voltages generated in this way may also be used as an input to the internal circuitry of the memory banks 202(0)-(N). For example, the local bias voltage may be used as an input to a sense amplifier 228 for performing a read operation on one of the memory banks 202(0)-(N). In other examples, depending on whether or not the isolation switch 218 is in a conductive or isolated state, the local bias generator 210 may receive either the bias voltages 214 or the local bias voltage as an input and, in response, generate a voltage reference (Vref) 226 which may be provided as the input, for example power supply input, to the sense amplifier 228 for performing the read operation.

While the isolation switch 218 is able to isolate the charge pumps 208 and the local bias generator 210 from the voltages generated by the global systems, noise caused by reading or writing one of the memory banks 202(0)-(N) may also transfer to neighboring memory banks through the power supply over the conductors on the device, the device substrate, or the package substrate of the memory device 200. To reduce the noise transferred over the device substrate or conductors on the device via the power supply, each of the memory banks 202(0)-(N) are placed within an isolated well and are equipped with dedicated external power supply pins 222 and 224 for connecting each of the memory banks 202(0)-(N) to a local dedicated power supply. For example, each of the memory banks 202(0)-(N) may be buried in a triple well or an n-well to shield the internal circuitry of the memory banks 202(0)-(N) from the noise transferred over the device substrate of the memory device 200.

The dedicated external power supply pins 222 and 224 may be connected to dedicated power supply pads on the package substrate of the memory device 200 to provide the local power supply to each of the memory banks 202(0)-(N). For example, the dedicated external power supply pins 222 may be connected to a power supply (e.g., VDD), and the dedicated external power supply pins 224 may be connected to ground (e.g., VSS). The dedicated external power supply pins 222 and 224 are also connected to the internal memory bank circuitry, such as the charge pumps 208 and the local bias generator 210 for providing the local power supply to the internal circuitry of each of the memory banks 202(0)-(N). For example, the dedicated external power supply pins 222 and 224 may be connected to the capacitors 220 to generate the local biases, which may be used by the internal circuitry of the memory bank 202(0), as described above.

In one example, a read or write access operation is being performed on memory bank 202(0) and the isolation switch 218 is placed in a isolated or disconnected state to isolate the bias voltages 214 generated by the bias system 212 from the internal memory bank circuitry of memory bank 202(0). For example, the bias voltages 214 may be isolated from capacitors 220 which store the input to the local bias generator 210, which may generate a voltage reference 226 based on the stored voltage on the capacitors 220 for use as an input to the sense amplifier 228.

In another example, a read or a write access operation may be performed on memory bank 202(1), which is a neighbor of memory bank 202(0), while no read or write operation is performed on memory bank 202(0). In this example, the isolation switch 218 is placed in a conductive or enabled state to allow the bias voltages 214 generated by the bias system 212 to connect to the internal memory bank circuitry of memory bank 202(0), while memory bank 202(0) receives a local power supply via the dedicated external power supply pins 222 and 224. The dedicated external power supply pins 222 and 224 also provide a power supply signal to the isolation circuit 216. By including the one or more capacitors 220 in the isolation circuitry 216, a local bias voltage may be maintained or restored within the memory bank 202(0) and, in some specific examples, may be provided as inputs to the internal memory bank circuitry of memory bank 202(0).

In the illustrated example, the internal circuitry of memory bank 202(0) is described. However, it should be understood that, in some examples, the internal circuitry including the isolation circuitry 216 and the dedicated external power supply pins 222 and 224 are repeated in the memory banks 204(1)-(N), such that each of the memory banks 202(0)-(N) may be isolated from the global systems and powered by a local power supply to reduce errors caused by noise associated with multiple memory banks 202(0)-(N) operating concurrently.

Figure 3:
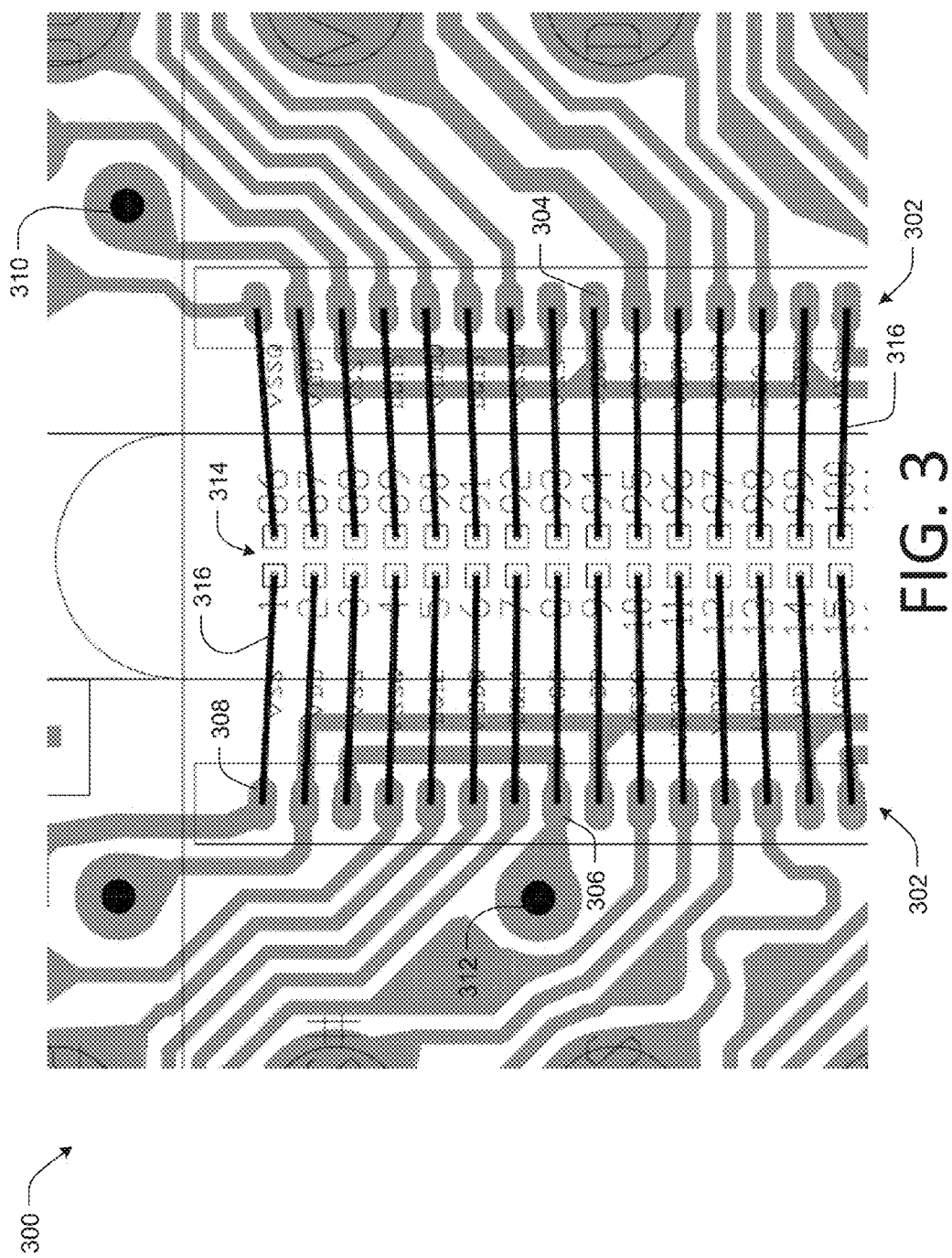
FIG. 3 illustrates an example architecture of a substrate having individual power supply pads for each memory bank according to some implementations.

FIGS. 1 and 2 provide example architectures of a memory device having multiple memory banks with isolation circuits and dedicated power supply pins connected to a local power supply on the memory device substrate. FIG. 3 illustrates an example architecture of a package substrate 300 having dedicated power supplies and power supply pads for each memory bank according to some implementations.

The package substrate 300 includes a plurality of bond pads, generally indicated by 302. The plurality of bond pads 302 includes power supply pads, such as dedicated power supply pads 304 and 306 and global supply pad 308. The global supply pad 308 is configured to provide power to global circuitry associated with the memory device of FIGS. 1 and 2, such as global bias system 112. The dedicated power supply pad 304 is connected with power supply 310 and dedicated power supply pad 306 is connected with ground 312 for providing a local power supply to a memory bank, such as memory bank 102(0) of FIG. 1.

In the illustrated example, the plurality of package substrate bond pads 302 are connected to a plurality of chip bond pads 314 associated with a memory bank of the memory device by a plurality of bond wires 316. In this manner, each of the memory banks are connected to a dedicated local power supply trace in the package substrate 300 to reduce noise transfer over the package substrate 300 caused by multiple memory banks performing read and/or write access operations concurrently.

In the illustrated example, the bond pads 302 associated with a single memory bank are shown. However, it should be understood that, in some examples, the architecture described above including the dedicated power supply pads 304 and 306, the local power supply 310 and the ground 312, are repeated for each of the memory banks connected to the package substrate 300, such that each of the memory banks receive a dedicated local power supply.

Figure 4:
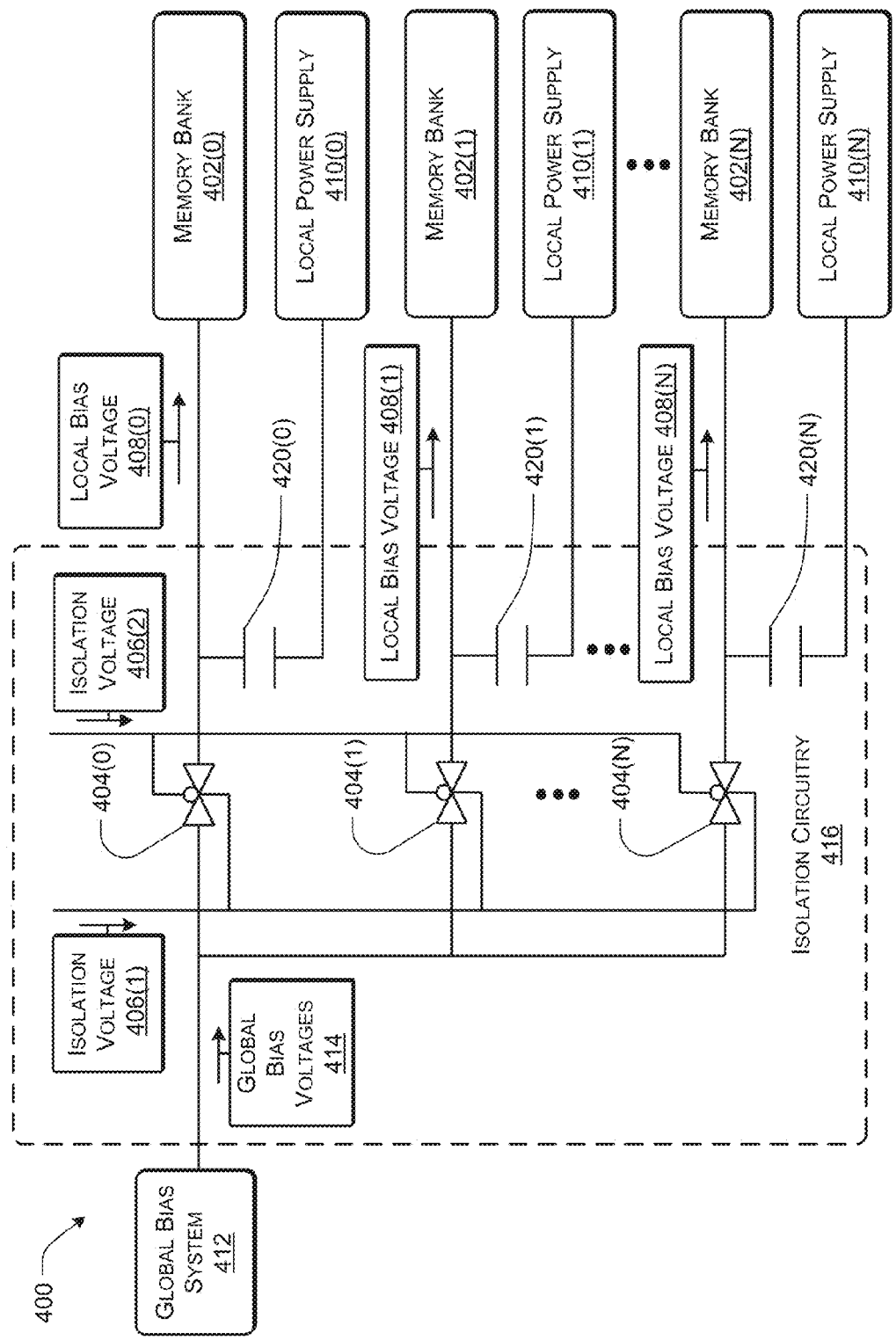
FIG. 4 illustrates an example diagram of a memory device including isolation circuitry according to some implementations.
Figure 5:
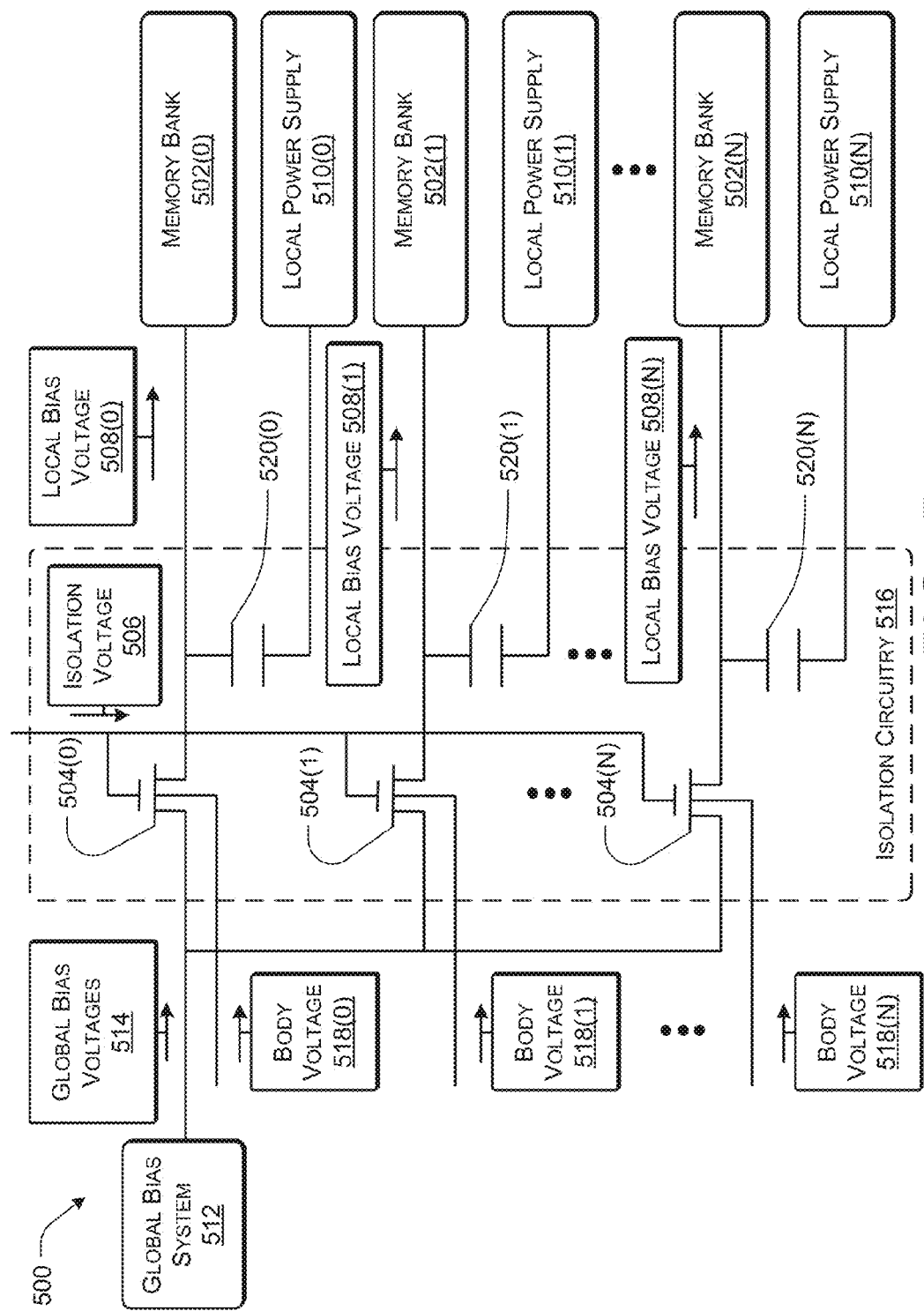
FIG. 5 illustrates an example diagram of a memory device including isolation circuitry according to some implementations.
Figure 6:
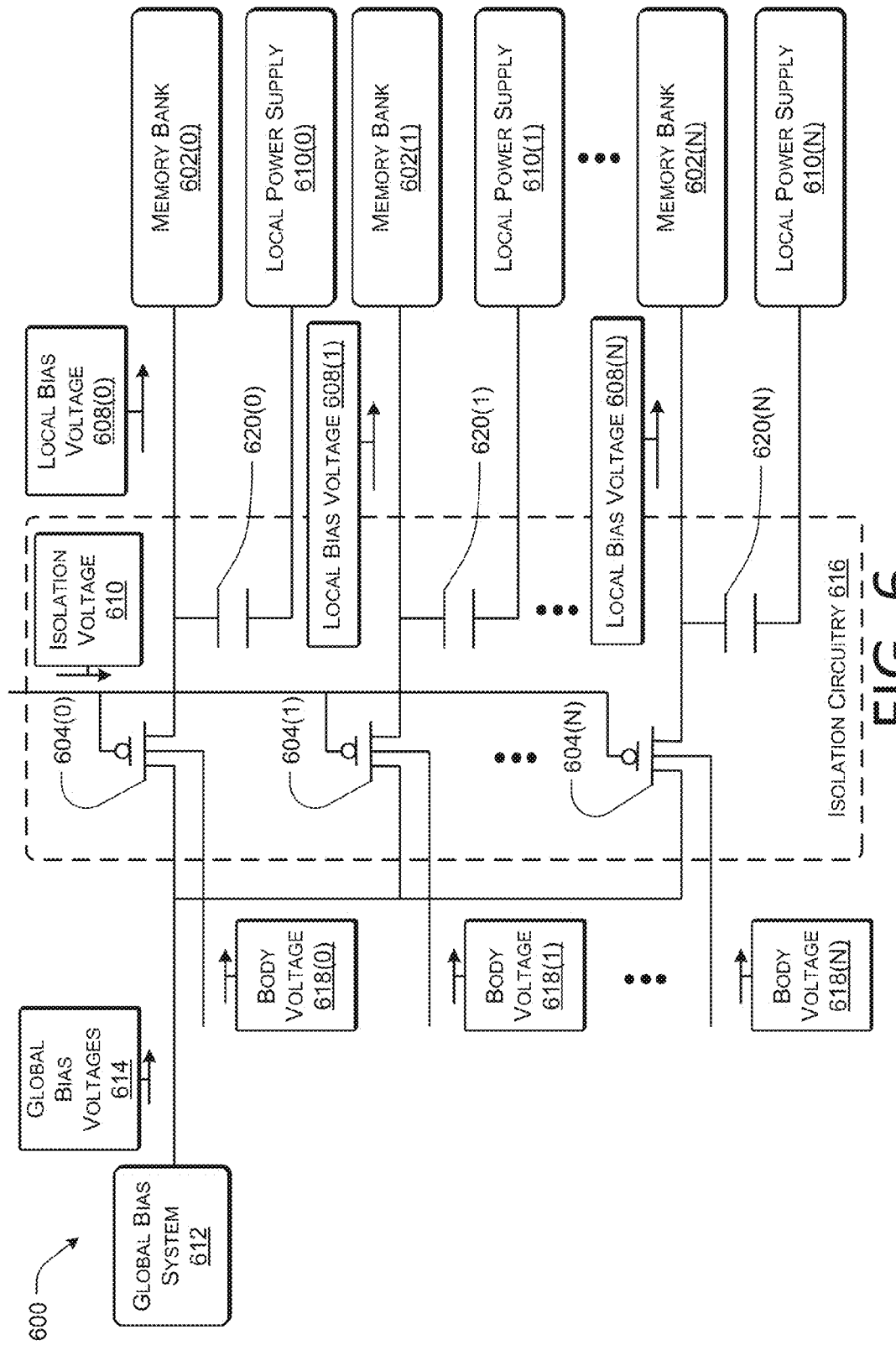
FIG. 6 illustrates an example diagram of a memory device including isolation circuitry according to some implementations.

FIGS. 1 and 2 provide example diagrams of a memory bank of a memory device including isolation circuitry. FIGS. 4-6 provide example implementations of the isolation circuitry associated with each of the memory banks of a memory device.

FIG. 4 illustrates an example diagram of a memory device 400 including isolation circuitry 416 according to some implementations. The isolation circuitry 416 includes multiple transfer gates 404(0)-(N), each of the transfer gates 404(0)-(N) connected to one of the memory banks 402(0)-(N). For example, as illustrated, transfer gate 404(0) is connected to memory bank 402(0), transfer gate 404(1) is connected to memory bank 402(1), and transfer gate 404(N) is connected to memory bank 402(N). Each of the transfer gates 404(0)-(N) are also connected to a global bias system 412 and configured to isolate the corresponding memory bank 402(0)-(N) from the global bias voltages 414 generated by the global bias system 412 when the corresponding memory bank 402(0)-(N) is performing a read or write operation that may generate noise. In this manner, the transfer gates 404(0)-(N) may reduce noise caused by voltage coupling to nearby memory banks, such as memory bank 402(0) and memory bank 402(1).

The transfer gates 404(0)-(N) are also configured to receive and respond to a first isolation voltage 406(1) and a second isolation voltage 406(2). For example, when the first isolation voltage 406(1) is low and the second isolation voltage 406(2) is high, the transfer gates 404(0)-(N) are in a disconnected state and the memory banks 402(0)-(N) are isolated from the global bias voltages 414. When the first isolation voltage 406(1) is high and the second isolation voltage 406(2) is low, the transfer gates 404(0)-(N) are in a conductive state and the memory banks 402(0)-(N) may receive the global bias voltages 414.

Each of the transfer gates 404(0)-(N) and the memory banks 402(0)-(N) are also connected to the same electrode of at least one capacitor 420(0)-(N), as illustrated. For example, transfer gate 404(0) and memory bank 402(0) are connected to capacitor 420(0), transfer gate 404(1) and memory bank 402(1) are connected to capacitor 420(1) and transfer gate 404(N) and memory bank 402(N) are connected to capacitor 420(N). Each of the capacitors 420(0)-(N) are also connected on the opposite electrode to a corresponding local power supply 410(0)-(N) for maintaining a local bias voltage 408(0)-(N), when the corresponding transfer gate 404(0)-(N) is turned off.

As discussed above with respect to FIGS. 1-3, each of the local power supplies 410(0)-(N) are individual power supplies dedicated to the corresponding memory bank 402(0)-(N), such that each memory bank 402(0)(N) is able to receive power from a separate power supply. By utilizing local power supplies 410(0)-(N) and dedicated capacitors 420(0)-(N), the local bias voltages 408(0)-(N) may be customized for each of the memory banks 402(0)(N), such that the local bias voltages 408(0)-(N) may vary from one another based on either or both of the local power supply voltage and the size of the capacitor 420(0)-(N).

In general, when the memory device 400 is writing to a first memory bank 402(0) of the memory banks 402(0)-(N), the memory device 400 generates a global bias voltages 414 intended as an input to other memory banks 402(1)-(N). To prevent noise generated during the write to the first memory bank 402(0) from coupling to the global bias voltages 414 and having an undesirable impact on one or more of the other memory banks 402(1)-(N) and/or causing feedback to the global bias system 412, the memory device 400 turns off the transfer gates 404(1)-(N) associated with memory bank 402(0) by manipulating the first isolation voltage 406(1) and the second isolation voltage 406(2).

In this manner, the first memory bank 402(0) receives the local bias voltage 408(0) dedicated to bank 402(0) and the other memory banks 402(1)-(N) receive the global bias voltages 414. For example, if no operation is being performed on memory bank 402(0) and a write is being performed on memory bank 402(1), transfer gate 404(0) is placed in a conductive state and transfer gate 404(1) is turned off. In this example, the memory bank 402(0) may receive the global bias voltages 414 as an input to an internal bias generator (e.g., the local bias generator 110 illustrated in FIG. 1) to maintain or restore the voltage level stored on capacitors 420(0) and the memory bank 402(1) may receive local bias voltage 418(1) as an input to an internal bias generator (e.g., the local bias generator 110 illustrated in FIG. 1) as part of the write operation.

FIG. 4 provides one example of isolation circuitry that may be incorporated into each of the memory banks of the memory device for isolating the memory banks from the global systems. FIG. 5 provides a second example of isolation circuitry.

FIG. 5 illustrates an example diagram of a memory device 500 including isolation circuitry 516 according to some implementations. The isolation circuitry 516 includes multiple NMOS devices 504(0)-(N), each of the NMOS devices 504(0)-(N) are connected to one memory bank of multiple memory banks 502(0)-(N). For example, as illustrated, NMOS 504(0) is connected to memory bank 502(0), NMOS 504(1) is connected to memory bank 502(1), and NMOS 504(N) is connected to memory bank 502(N). Each of the NMOS devices 504(0)-(N) are also connected to a global bias system 512 and configured to isolate the corresponding memory bank 502(0)-(N) from the global bias voltages 514 generated by the global bias system 512 when the corresponding memory bank 502(0)-(N) is performing a read or write operation that may generate noise. In this manner, the NMOS devices 504(0)-(N) are able to reduce noise caused by voltage coupling onto the global bias system 512 and nearby memory banks, such as memory bank 502(0) and 502(1).

The NMOS devices 504(0)-(N) are also configured to receive and respond to an isolation voltage 506 and a body voltage 518(0)-(N). Generally, the isolation voltage 506 is a control voltage for operating the NMOS devices 504(0)-(N) and each of the body voltages 518(0)-(N) control threshold voltages for activating the corresponding NMOS devices 504(0)-(N). For example, when the global bias voltages 514 and the body voltages 518(0)-(N) are below ground and the isolation voltage 506 is driven to a level as low as that of the global bias voltages 514, the NMOS devices 504(0)-(N) are turned off and the memory banks 502(0)-(N) are isolated from the global bias voltages 514. Alternatively, when the isolation voltage 506 is higher than that of the global bias voltages 514, the NMOS devices 504(0)-(N) are in a conductive state and the memory banks 502(0)-(N) may receive the global bias voltages 514. It should be understood that in some implementations the body voltages 518(1)-(N) may be identical while in other implementations each of the body voltages 518(0)-(N) may be tailored to the corresponding memory bank 502(0)-(N), for example connected to the corresponding local power supply 510(0)-(N), and, thus, may differ from one another.

Each of the NMOS devices 504(0)-(N) and the memory banks 502(0)-(N) are also connected to the same electrode of at least one capacitor 520(0)-(N), as illustrated. For example, NMOS 504(0) and memory bank 502(0) are connected to capacitor 520(0), NMOS 504(1) and memory bank 502(1) are connected to capacitor 520(1) and NMOS 504(N) and memory bank 502(N) are connected to capacitor 520(N). Each of the capacitors 520(0)(N) are also connected on the opposite electrode to corresponding local power supply 510(0)-(N) for maintaining a local bias voltage 508(0)-(N), while the corresponding NMOS 504(0)-(N) is isolated.

As discussed above with respect to FIGS. 1-3, each of the local power supplies 510(0)-(N) are individual power supplies dedicated to the corresponding memory bank 502(0)-(N), such that each memory bank 502(0)(N) is able to receive a separate power supply. By utilizing local power supplies 510(0)-(N) and dedicated capacitors 520(0)-(N), the local bias voltages 508(0)-(N) may be customized for each of the memory banks 502(0)(N), such that the local bias voltages 508(0)-(N) may vary from one another based on either or both of the local power supply voltage and the size of the capacitor 520(0)-(N).

In general, when the memory device 500 is writing to a first memory bank 502(0) of the memory banks 502(0)-(N), the memory device 500 generates a global bias voltages 514 intended as an input the other memory bank 502(1)-(N). To prevent noise generated by memory bank 502(0) from coupling to the global bias voltages 514 and, thereby, coupling to other memory banks 502(1)-(N) and/or causing feedback to the global bias system 512, the memory device 500 turns off the NMOS 504(0) associated with the memory bank 502(0) by manipulating the isolation voltage 506.

In this manner, the first memory bank 502(0) receives the local bias voltage 508(0) dedicated to memory bank 502(0) and the other memory banks 504(1)-(N) receive the global bias voltages 514. For example, if no operation is being performed on memory bank 502(0) and a write operation is being performed on memory bank 502(1), NMOS 504(0) is placed in a conductive state and NMOS 504(1) is placed in an isolated state. In this example, the memory bank 502(0) may receive the global bias voltages 514 as an input to a local bias generator (e.g., the local bias generator 110 as illustrated in FIG. 1) and the memory bank 502(1) may receive local bias voltage 518(1) as in input to a local bias generator (e.g., the local bias generator 110 as illustrated in FIG. 1) as part of the write operation.

FIGS. 4 and 5 provide example circuits that may be incorporated into each of the memory banks of the memory device for isolating the memory banks from the global systems. FIG. 6 provides another example of isolation circuitry.

FIG. 6 illustrates an example diagram of a memory device 600 including isolation circuitry 616 according to some implementations. The isolation circuitry 616 includes multiple PMOS devices 604(0)-(N), each of the PMOS devices 604(0)-(N) are connected to one of the memory banks 602(0)-(N). For example, as illustrated, PMOS 604(0) is connected to memory bank 602(0), PMOS 604(1) is connected to memory bank 602(1) and PMOS 604(N) is connected to memory bank 602(N). Each of the PMOS devices 604(0)-(N) are also connected to a global bias system 612 and configured to isolate the corresponding memory bank 602(0)-(N) from the global bias voltages 614 generated by the global bias system 612 when the corresponding memory bank 602(0)-(N) is performing a read or write operation that may generate noise. In this manner, the PMOS devices 604(0)-(N) are able to reduce noise caused by voltage coupling to nearby memory banks, such as memory bank 602(0) and 602(1).

The PMOS devices 604(0)-(N) are also configured to receive and respond to an isolation voltage 606 and a body voltage 618(0)-(N). Generally, the isolation voltage 606 is a control voltage for operating the PMOS devices 604(0)-(N) and the body voltages 618(0)-(N) control threshold voltages for activating the PMOS devices 604(0)-(N). For example, when the global bias voltages 614 and the body voltages 618(0)-(N) are above the power supply voltage and the isolation voltage 606 is driven to a level as high as that of the global bias voltages 614, the PMOS devices 604(0)-(N) are placed in a disconnected state and the memory banks 602(0)-(N) are isolated from the global bias voltages 614 and when the isolation voltage 606 is lower than the voltage of the global bias voltages 614 the PMOS devices 604(0)-(N) are placed in a conductive state and the memory banks 602(0)-(N) may receive the global bias voltages 614.

Each of the PMOS devices 604(0)-(N) and the memory banks 602(0)-(N) are also connected to the same electrode of at least one capacitor 620(0)-(N), as illustrated. For example, PMOS 604(0) and memory bank 602(0) are connected to capacitor 620(0), PMOS 604(1) and memory bank 602(1) are connected to capacitor 620(1) and PMOS 604(N) and memory bank 602(N) are connected to capacitor 620(N). Each of the capacitors 620(0)-(N) are also connected on the opposite electrode to corresponding local power supply 610(0)-(N) for maintaining a local bias voltage 608(0)-(N), when the corresponding PMOS 604(0)-(N) is turned off.

As discussed above with respect to FIGS. 1-3, each of the local power supplies 610(0)-(N) are individual power supplies dedicated to the corresponding memory bank 602(0)-(N), such that each memory bank 602(0)-(N) is able to receive power from a separate dedicated power supply. By utilizing local power supplies 610(0)-(N) and dedicated capacitors 620(0)-(N), the local bias voltages 608(0)-(N) may be customized for each of the memory banks 602(0)-(N), such that the local bias voltages 608(0)-(N) may vary from one another based on either or both of the local power supply voltage and the size of the capacitor 620(0)-(N).

In general, when the memory device 600 is writing to a first memory bank of the memory banks 602(0)-(N), the memory device 600 generates a global bias voltages 614 intended as an input to the first memory bank 602(0). To prevent the global bias voltages 614 from coupling to other memory banks 602(1)-(N) and/or causing feedback to the global bias system 612, the memory device 600 turns off the PMOS 604(1)-(N) associated with the other memory banks 602(1)-(N) by manipulating the isolation voltage 606.

In this manner, the first memory bank 602(0) receives the global bias voltages 614 and the other memory banks 602(1)-(N) receive the local bias voltage 608(1)-(N) dedicated to each of the other memory banks 602(1)-(N). For example, if a no operation is being performed on memory bank 602(0) and a write operation is being performed on memory bank 602(1), PMOS 604(0) is placed in a conductive state and PMOS 604(1) is placed in an isolated state. In this example, the memory bank 602(0) may receive the global bias voltages 614 as an input to a charge pump (e.g., the charge pump 108 as illustrated in FIG. 1) and the memory bank 602(1) may receive local bias voltage 608(1) as in input to a sense amplifier (e.g., the sense amplifier 228 as illustrated in FIG. 2) as part of the write operation.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A memory device comprising:
    a plurality of memory banks, the plurality of memory banks including at least a first memory bank and a second memory bank;
    at least one global bias system to generate a voltage bias for controlling the plurality of memory banks;
    the first memory bank comprising:
        one or more dedicated power supply pins for coupling the first memory bank to a first local power supply, the first local power supply dedicated to the first memory bank;
        a first isolation switch coupled to at least one global bias system to decouple the first memory bank from the global bias system; and
        a first capacitor coupled to the first isolation switch and the first local power supply to maintain a first local bias on the first memory bank when the global bias system is decoupled from the first memory bank;
    the second memory bank comprising:
        one or more dedicated power supply pins for coupling the second memory bank to a second local power supply, the second local power supply dedicated to the second memory bank;
        a second isolation switch coupled to the at least one global bias system to decouple the second memory bank from the global bias system; and
        a second capacitor coupled to the second isolation switch and the second local power supply to maintain a second local bias on the second memory bank when the global bias system is decoupled from the second memory bank.

2. The memory device as recited in claim 1, wherein the first memory bank further comprises internal memory bank circuitry coupled to the first local power supply for receiving the first local power supply dedicated to the first memory bank.

3. The memory device as recited in claim 2, wherein the first isolation switch is coupled to the internal memory bank circuitry to provide the voltage bias to the internal memory bank circuitry when the first isolation switch is turned on and to prevent the voltage bias from reaching the internal memory bank circuitry when the first isolation switch is turned off.

4. The memory device as recited in claim 1, wherein the first isolation switch is at least one of:
    a transfer gate;
    a PMOS; or
    an NMOS.

5. The memory device as recited in claim 1, wherein the first memory bank includes a sense amplifier that receives the voltage bias as an input.

6. The memory device as recited in claim 1, wherein the first memory bank includes a sense amplifier that receives the first local bias as an input.

7. The memory device as recited in claim 1, wherein the first memory bank includes:
a local bias generator which receives either the bias voltage or the first local bias as an input and generates a voltage reference as an output.

8. The memory device as recited in claim 1, wherein isolated well biasing is applied to the first and second memory banks.

9. A memory device comprising:
a first memory bank comprising:
a first memory bank circuit for controlling access operations on the first memory bank;
one or more dedicated power supply pins for coupling the first memory bank circuit to a first local power supply, the first local power supply dedicated to the first memory bank; and
a second memory bank comprising:
a second memory bank circuit for controlling access operations on the second memory bank; and
one or more dedicated power supply pins for coupling the second memory bank circuit to a second local power supply, the second local power supply dedicated to the second memory bank.

10. The memory device as recited in claim 9, further comprising:
a global bias system to generate a voltage bias;
wherein the first memory bank includes a first isolation switch coupled the global bias system to decouple the first memory bank circuit from the global bias system in response to receiving an isolation voltage; and
wherein the second memory bank including a second isolation switch coupled to at least one global bias system to decouple the second memory bank circuit from the global bias system in response to receiving the isolation voltage.

11. The memory device as recited in claim 10, wherein:
the first memory bank includes a first capacitor coupled to the first isolation switch and the first local power supply to maintain a first local bias on the first memory bank when the global bias system is decoupled from the first memory bank; and
the second memory bank includes a second capacitor coupled to the second isolation switch and the second local power supply to maintain a second local bias on the second memory bank when the global bias system is decoupled from the second memory bank.

12. The memory device as recited in claim 10, further comprising:
a first capacitor coupled to the first isolation switch and the first local power supply to maintain a first local bias on the first memory bank when the global bias system is decoupled from the first memory bank; and
a second capacitor coupled to the second isolation switch and the second local power supply and to maintain a second local bias on the second memory bank when the global bias system is decoupled from the second memory bank.

13. The memory device as recited in claim 9, further comprising a global bias system to generate a voltage bias and wherein the first memory bank circuit includes a sense amplifier that receives the voltage bias as an input.

14. The memory device as recited in claim 9, further comprising:
a global bias system to generate a voltage bias; and
wherein the first memory bank circuit includes a local bias generator that receives the voltage bias as an input and generates a reference voltage as an output.

15. The memory device as recited in claim 9, wherein:
the first local power supply and the second local power supply are located on a package substrate of the memory device;
the one or more dedicated power supply pins of the first memory bank are coupled to a first set of bond pads on the package substrate, the first set of bond pads dedicated to the first memory bank and at least one of the first set of bond pads coupled to the first local power supply; and
the one or more dedicated power supply pins of the second memory bank are coupled to a second set of bond pads on the package substrate, the second set of bond pads dedicated to the second memory bank and at least one of the second set of bond pads coupled to the second local power supply.

16. A circuit comprising:
a first isolation switch including a first terminal for receiving a voltage bias, a second terminal, a third terminal for receiving a first isolation voltage and a fourth terminal for receiving a second isolation voltage;
a second isolation switch including a first terminal for receiving the voltage bias, a second terminal, a third terminal for receiving the isolation voltage and a fourth terminal for receiving the second isolation voltage;
a first memory bank coupled to the second terminal of the first isolation switch for receiving the voltage bias when the first isolation switch is turned on;
a second memory bank coupled to the second terminal of the second isolation switch for receiving the voltage bias when the second isolation switch is turned on;
a first capacitor including a first electrode coupled to the second terminal of the first isolation switch and a second electrode coupled to a first power supply; and
a second capacitor including a first electrode coupled to the second terminal of the second isolation switch and a second electrode coupled to second power supply.

17. The circuit as recited in claim 16, wherein the first isolation switch and the second isolation switch are transfer gates and the first isolation switch isolates the first memory bank from the voltage bias and the second isolation switch isolates the second memory bank from the voltage bias when the first isolation voltage is high and the second isolation voltage is low.

18. The circuit as recited in claim 16, wherein the first isolation switch and the second isolation switch are NMOS devices and the first isolation switch isolates the first memory bank from the voltage bias and the second isolation switch isolates the second memory bank from the voltage bias when the first isolation voltage and the second isolation voltage are at a voltage lower than or equal to the first isolation voltage.

19. The circuit as recited in claim 16, wherein the first isolation switch and the second isolation switch are PMOS devices and the first isolation switch isolates the first memory bank from the voltage bias and the second isolation switch isolates the second memory bank from the voltage bias when the first isolation voltage and the second isolation voltage are at a voltage higher than or equal to the first isolation voltage.

20. The circuit as recited in claim 16, wherein:
the first memory bank receives a first local bias generated at least in part by the first power supply and the first capacitor when the first isolation switch is turned off; and
the second memory bank receives a second local bias generated at least in part by the second power supply and the second capacitor when the second isolation switch is turned off.

* * * * *